United States Patent
Yen et al.

(10) Patent No.: US 6,803,305 B2
(45) Date of Patent: Oct. 12, 2004

(54) METHOD FOR FORMING A VIA IN A DAMASCENE PROCESS

(75) Inventors: Daniel Yen, Singapore (SG); Wei Hua Cheng, Singapore (SG); Yakub Aliyu, Basking Ridge, NJ (US); Ding Yi, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 35 days.

(21) Appl. No.: 10/120,755

(22) Filed: Apr. 10, 2002

(65) Prior Publication Data

US 2003/0194856 A1 Oct. 16, 2003

(51) Int. Cl.⁷ .................... H01L 21/4763; H01L 23/34
(52) U.S. Cl. ........................ 438/618; 438/713
(58) Field of Search ................. 438/618, 792, 438/701, 640, 633, 624, 622, 238, 623, 2, 723, 612; 257/741

(56) References Cited

U.S. PATENT DOCUMENTS 6,424,038 B1 * 7/2002 Bao et al. .................... 257/741
6,440,838 B1 * 8/2002 Lui et al. ..................... 438/618
6,566,260 B2 * 5/2003 Chooi et al. ................. 438/687

* cited by examiner

Primary Examiner—David A. Zarnela
Assistant Examiner—Monica D. Harrison

(57) ABSTRACT

A method for forming a via in a damascene process. In one embodiment, the present method comprises depositing a material into a via formed using a damascene process. More particularly, in one embodiment, the material which is comprised of a substantially conformal material which has an etch selectivity with respect to the substrate into which the via is formed. Furthermore, in this embodiment, the material is deposited along the sidewalls and the base of the via. Next, the present embodiment etches material such that the via is formed having a profile conducive to the adherence of overlying material thereto. In this embodiment, the etching of the material is performed without substantially etching the substrate into which the via is formed. In so doing, the present embodiment creates a via in a damascene process which allows for the formation of a metallized interconnect which is substantially free of voids.

21 Claims, 15 Drawing Sheets

METHOD FOR FORMING A VIA IN A DAMASCENE PROCESS

FIELD OF THE INVENTION

The present claimed invention relates to the field of semiconductor processing. More particularly, the present claimed invention relates to a method for forming a via in a damascene process.

BACKGROUND ART

As semiconductor geometries continue to become smaller and smaller, new difficulties arise in the fabrication of the correspondingly smaller features. As one example, when device sizes decrease in size (in order to form more devices on each wafer), features such as vias have critical dimensions (CDs) which become considerably smaller. The reduced CD of, for example, a via has certain drawbacks associated therewith. Referring now to Prior Art FIG. 1A, a side sectional view of a via formed in a damascene process wherein the via has a reduced CD is shown. In Prior Art FIG. 1A, a substrate 100 has a via 102 formed therein using a damascene process. In the structure of Prior Art FIG. 1A, the critical dimension (CD) is shown as the width, W, at the top of via 102. Furthermore, via 102 has a depth, D.

Referring still to Prior Art FIG. 1A, as the CD of via 102 decreases, significant manufacturing difficulties arise. For example, in a damascene process, such a via is typically formed using a plurality (e.g. two major etches for the formation of via 102) of anisotropic etches in order to etch a sufficient depth into substrate 100 while still maintaining the desired CD for via 102. As a result, sharp corners, typically shown as 104a and 104b and 106a and 106b, are formed at the top edges present within via 102. Sharp corners 104a and 104b induce stress in subsequently deposited overlying layers and reduce adherence of the overlying layer to underlying substrate 100.

With reference now to Prior Art FIG. 1B, a side sectional view of via 102 of Prior Art FIG. 1A is shown having an overlying layer of material disposed thereon. As shown in Prior Art FIG. 1B, due to the presence of sharp corners (e.g. corners 104a, 104b, 106a, and 106b) and the profile of via 102, voids (typically shown as 108) are formed in the overlying layer of material. These voids deleteriously affect the integrity of the device, and may ultimately lead to failure of the device in which the void-containing via is used.

As critical dimensions of vias formed using the damascene process continue to decrease in size, it is expected that the above-described problems will be further exacerbated. Additionally, any attempts to eliminate or reduce the problems associated with damascene process-formed vias should be compatible with existing semiconductor fabrication processes such that a complete retooling of conventional semiconductor fabrication facilities is not required.

Thus, a need exists for a method for forming a via in a damascene process wherein the via does not suffer from poor adherence to a subsequently deposited overlying layer. Still another need exists for a method for forming a via in a damascene process which enables the formation of a metallized interconnect wherein the method meets the above need and wherein the metallized interconnect does not suffer from void/seam formation. Yet another need exists for a method for forming a via in a damascene process wherein the method meets all of the above-listed needs and wherein the method is compatible with existing semiconductor fabrication processes.

SUMMARY OF INVENTION

The present invention provides a method for forming a via in a damascene process wherein the via does not suffer from poor adherence to a subsequently deposited overlying layer. The present invention further provides a method for forming a via in a damascene process which enables the formation of a metallized interconnect wherein the method achieves the above accomplishment and wherein the metallized interconnect does not suffer from void/seam formation. The present invention also provides a method for forming a via in a damascene process wherein the method achieves all of the above-listed accomplishments and wherein the method is compatible with existing semiconductor fabrication processes.

In one embodiment of the present invention, the present method comprises depositing a material into a via formed using a damascene process. More particularly, in one embodiment, the material which is comprised of a substantially conformal material which has an etch selectivity with respect to the substrate into which the via is formed. Furthermore, in this embodiment, the material is deposited along the sidewalls and the base of the via. Next, the present embodiment etches material such that the via is formed having a profile conducive to the adherence of overlying material thereto. In this embodiment, the etching of the material is performed without substantially etching the substrate into which the via is formed. In so doing, the present embodiment creates a via in a damascene process which allows for the formation of a metallized interconnect which is substantially free of voids.

In another embodiment, the present invention includes the steps of the above-described embodiment, and further includes the step of depositing a layer of a conductive material into the via having the profile conducive to the adherence of overlying material thereto. After the deposition of the conductive material, the present embodiment performs a planarization step such that the conductive material remains primarily within the via. As a result, the present embodiment provides a metallized interconnect within a via formed in a damascene process, wherein the metallized interconnect is substantially free of voids.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

PRIOR ART

PRIOR ART

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
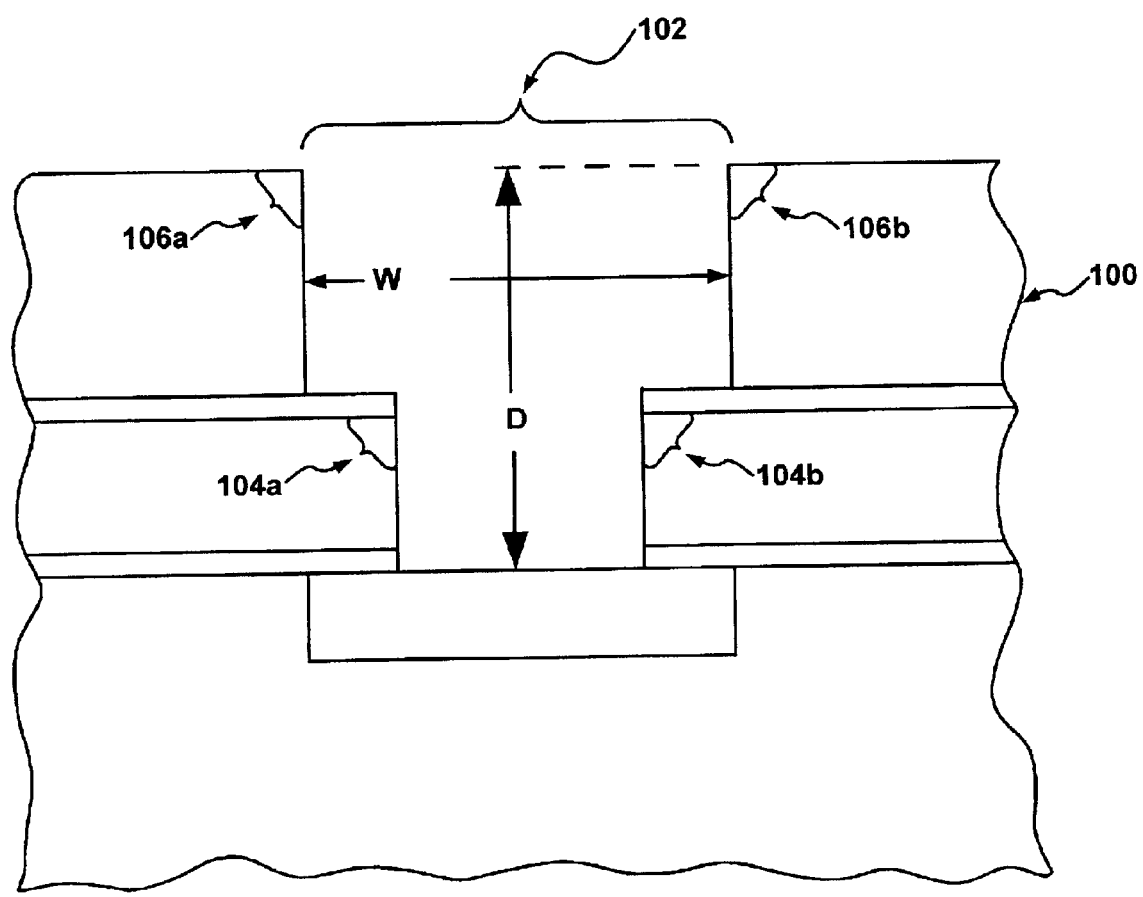
FIG. 1A is a side sectional view of a via formed into a substrate wherein the via has a small critical dimension.
Figure 1B:
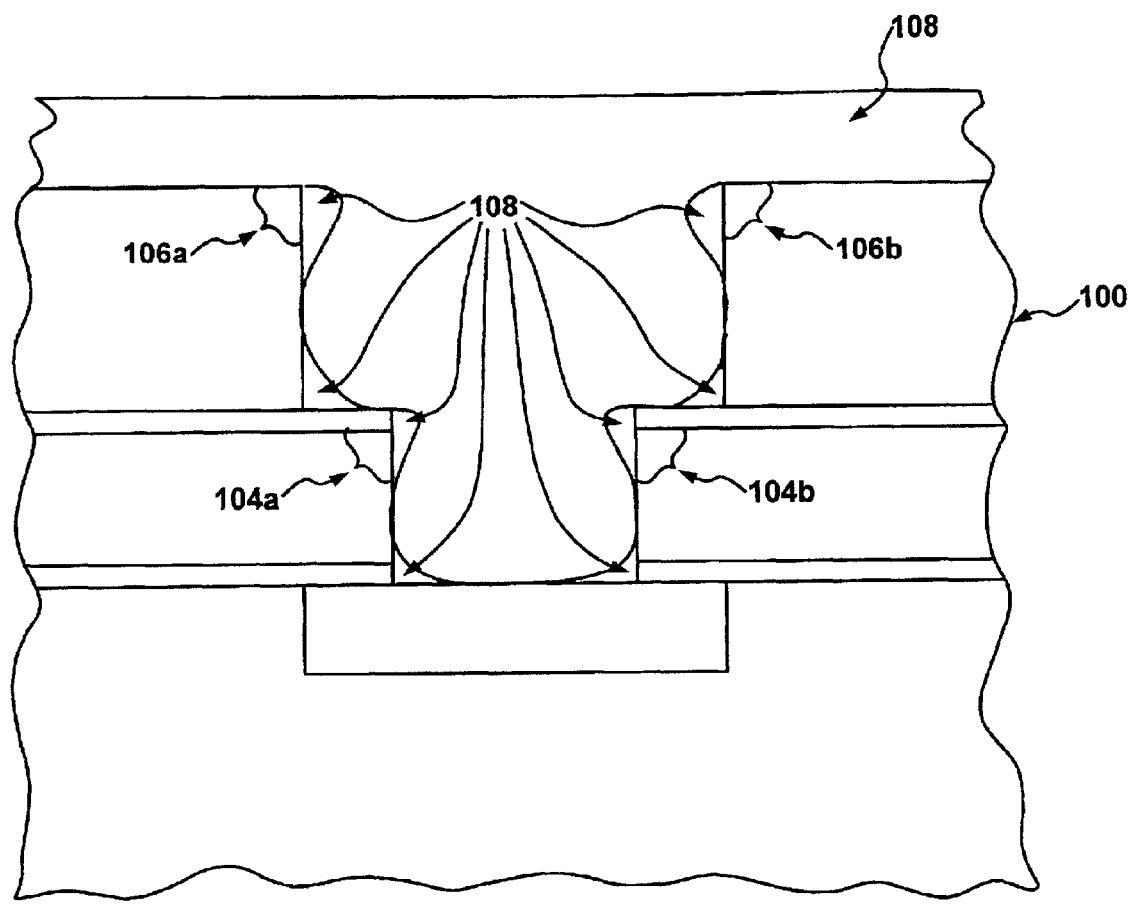
FIG. 1B is a side sectional view of the structure of PRIOR ART FIG. 1A having a layer of material disposed thereover.
Figure 2A:
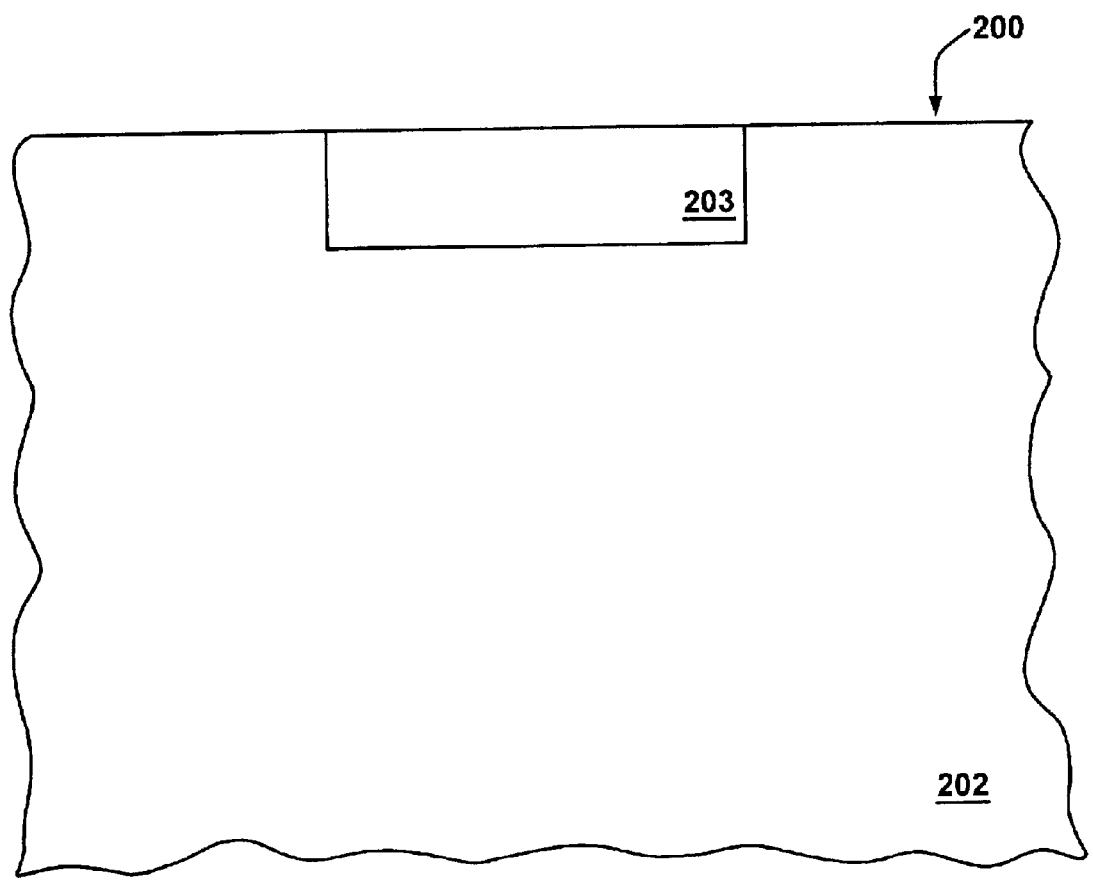
FIG. 2A is a side sectional view of a starting step in a method to form a void-free via in accordance with one embodiment of the present claimed invention.
Figure 2B:
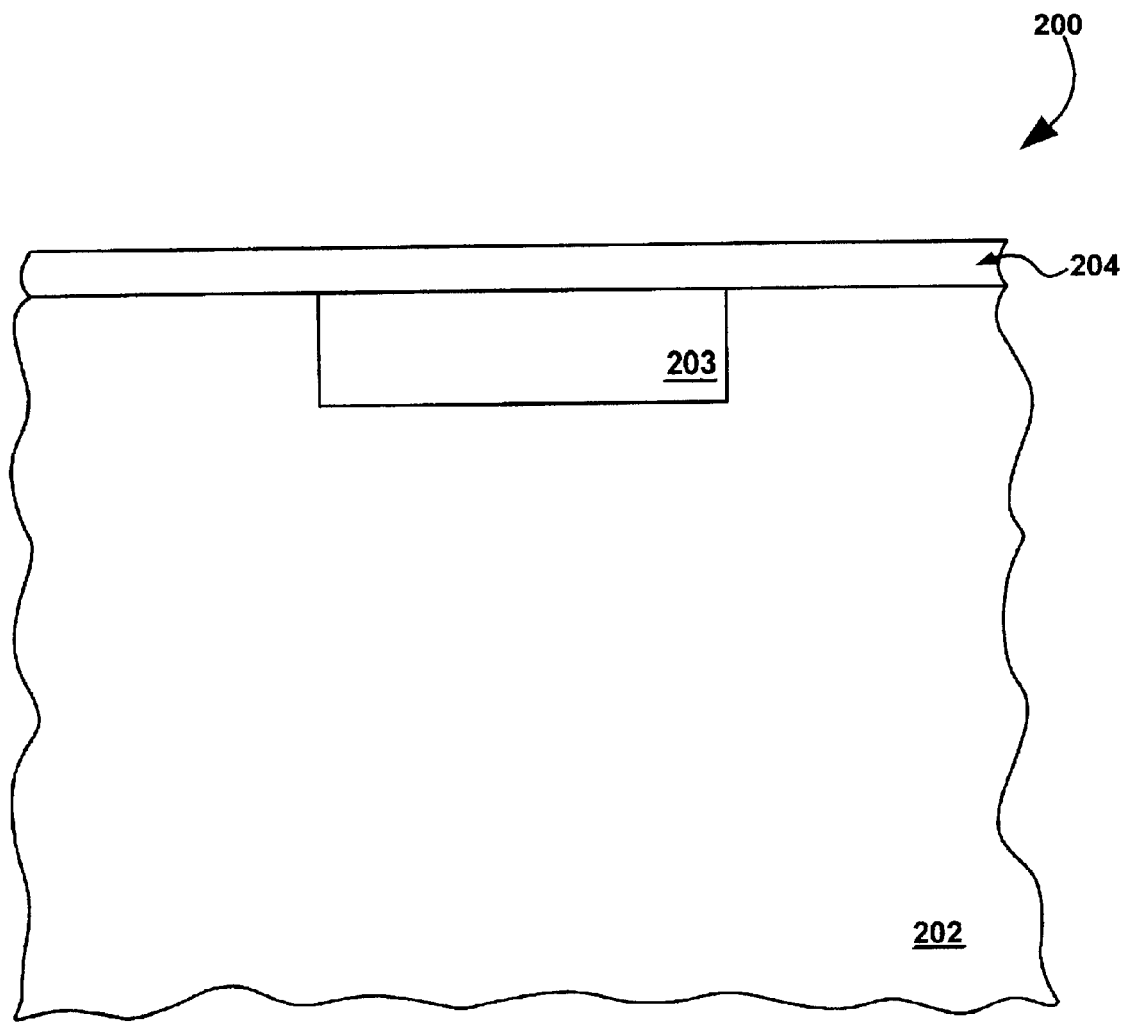
FIG. 2B is a side sectional view of the structure of FIG. 2A having a first etch stop layer disposed thereover in accordance with one embodiment of the present claimed invention.
Figure 2C:
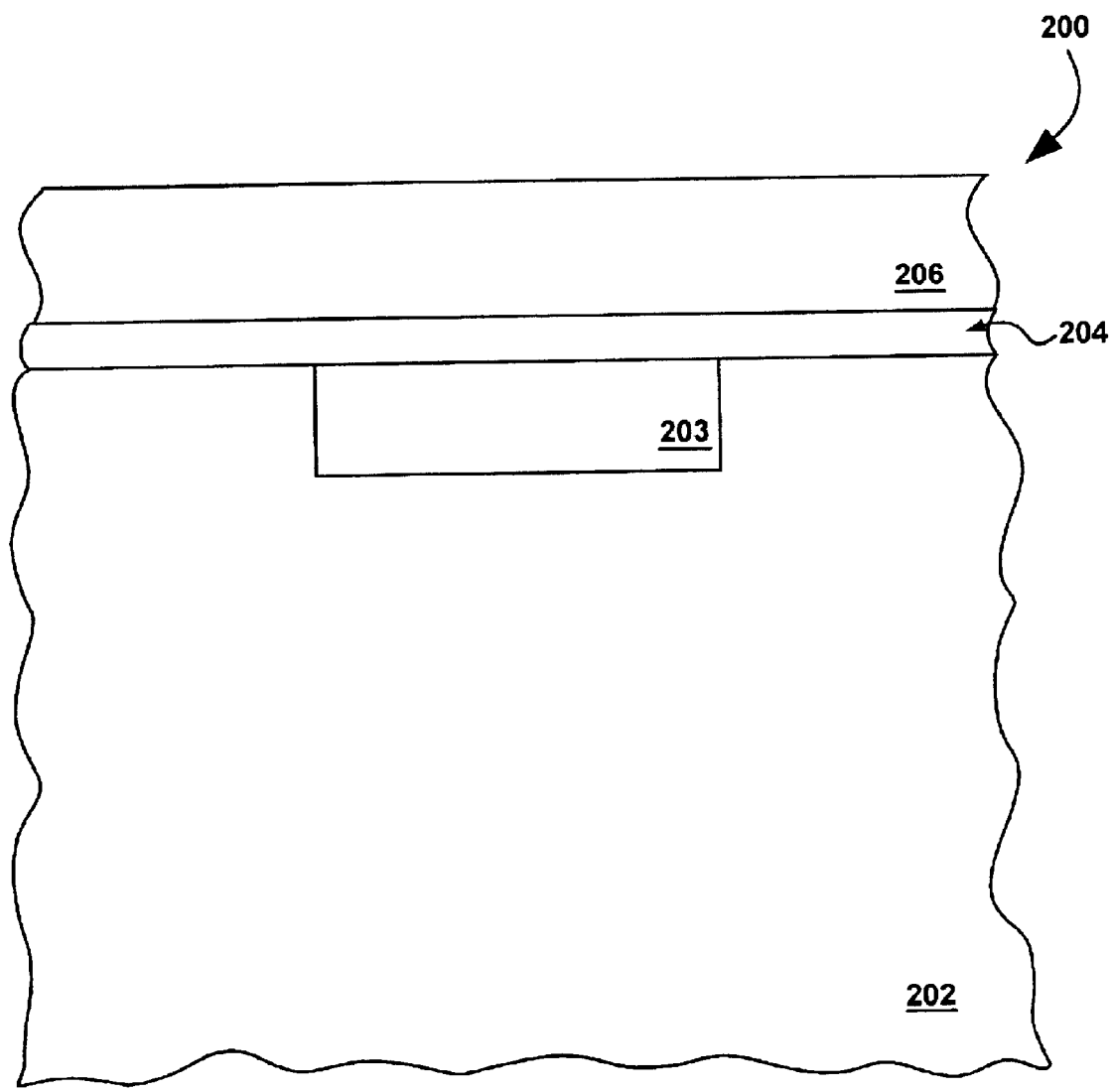
FIG. 2C is a side sectional view of the structure of FIG. 2B having a first material deposited above the first etch stop layer in accordance with one embodiment of the present claimed invention.
Figure 2D:
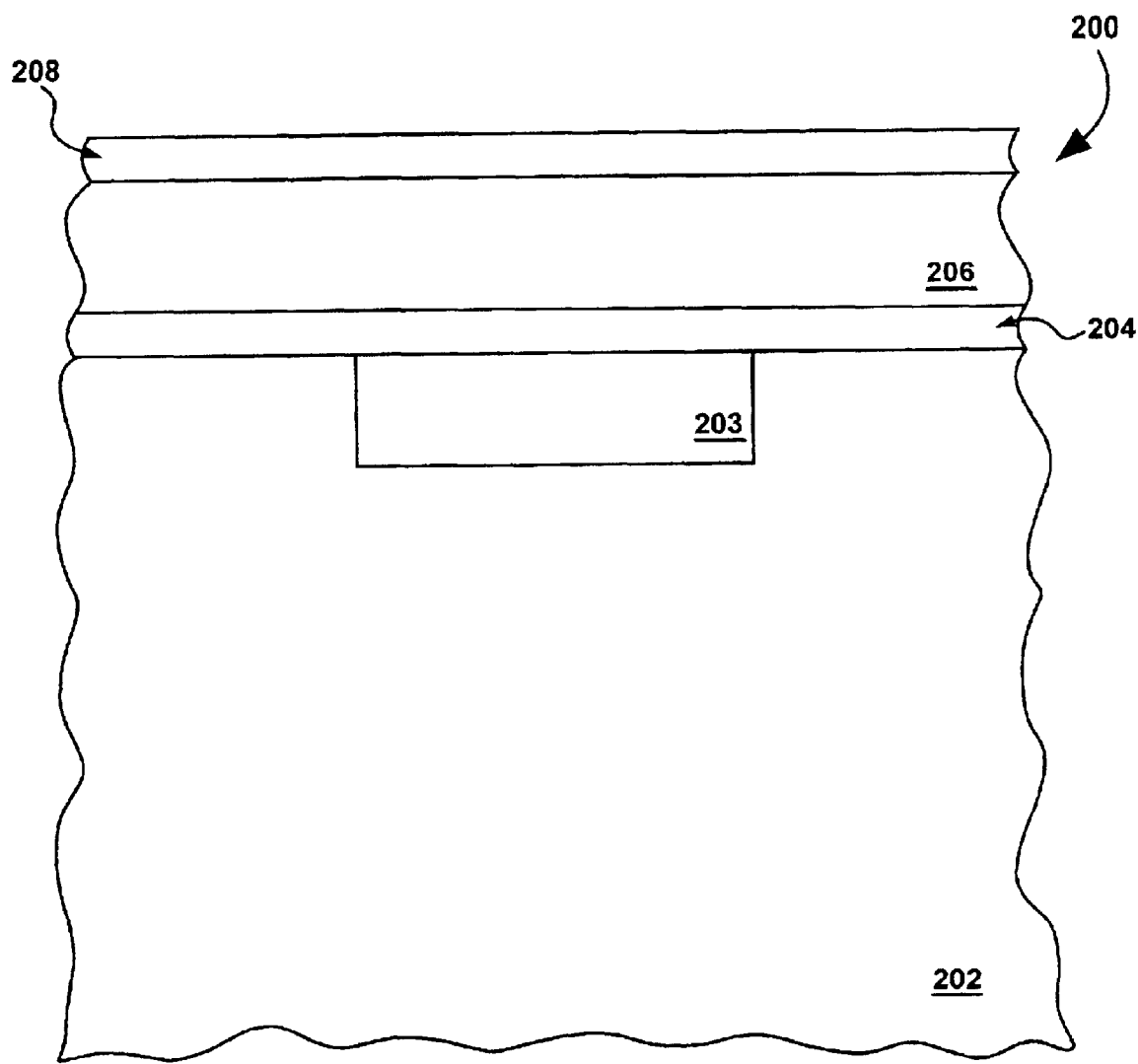
FIG. 2D is a side sectional view of the structure of FIG. 2C having a second etch stop layer disposed thereover in accordance with one embodiment of the present claimed invention.
Figure 2E:
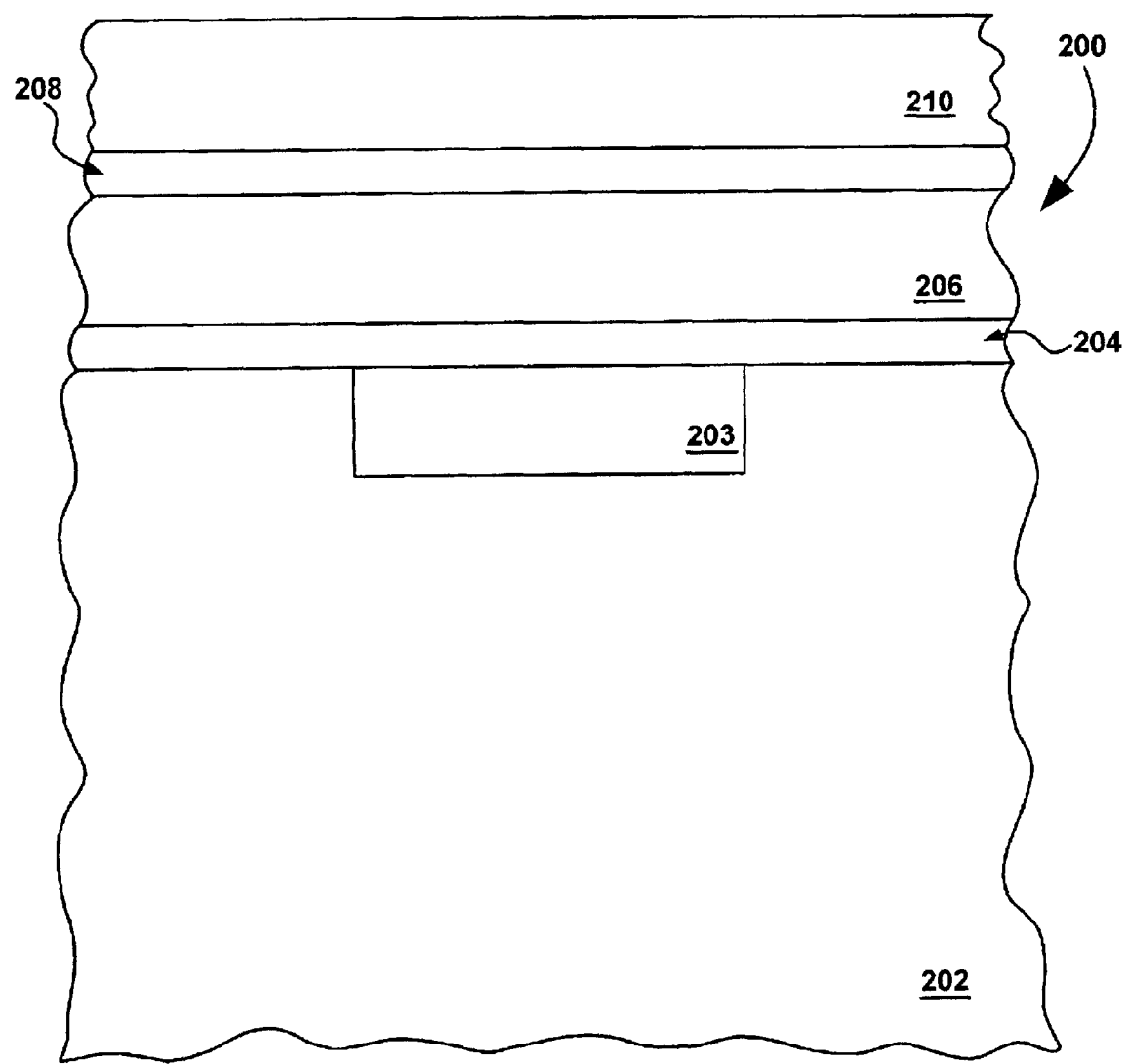
FIG. 2E is a side sectional view of the structure of FIG. 2D having a second material disposed thereover in accordance with one embodiment of the present claimed invention.
Figure 2F:
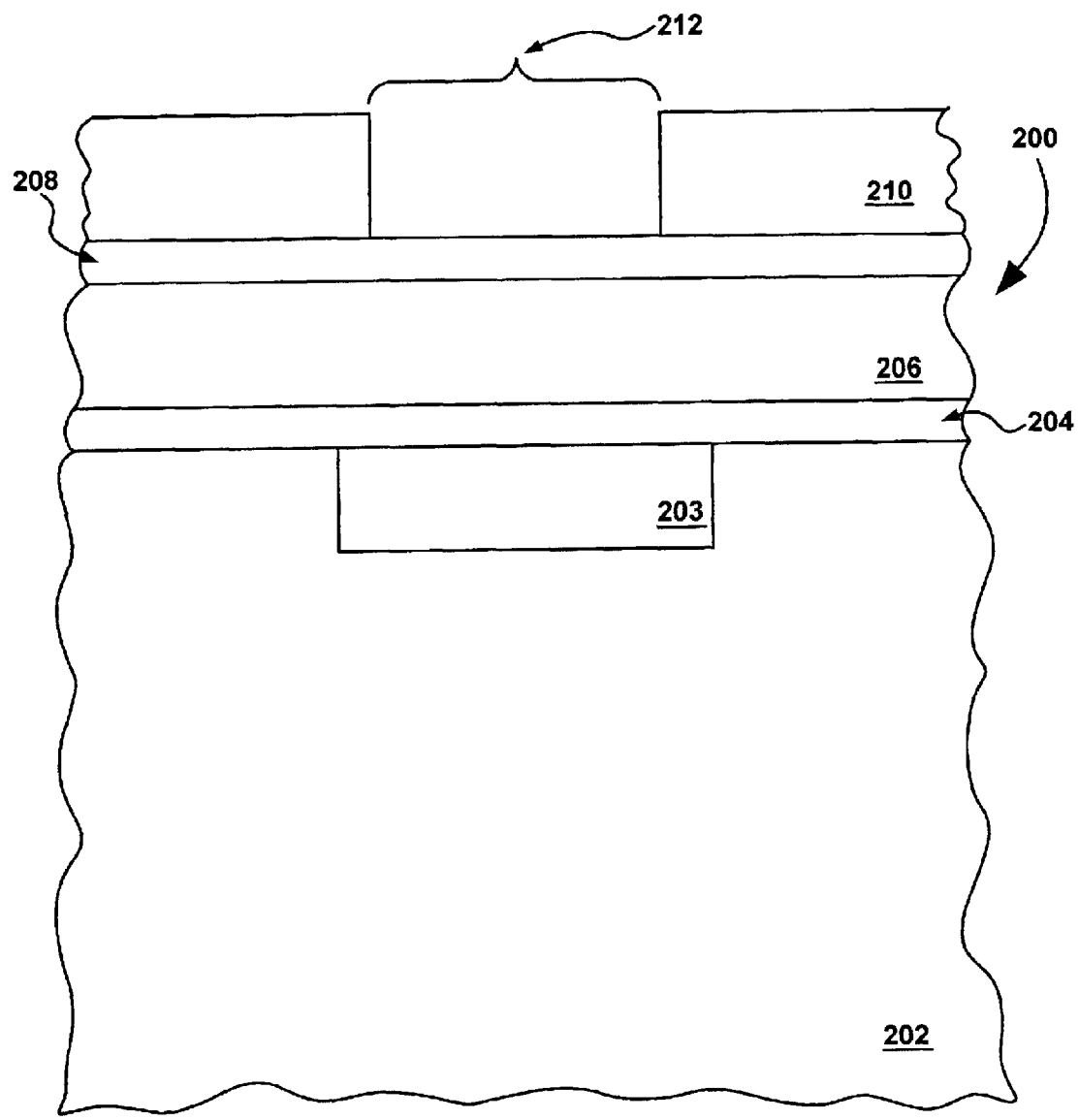
FIG. 2F is a side sectional view of the structure of FIG. 2E having an opening formed through the second material in accordance with one embodiment of the present claimed invention.
Figure 2G:
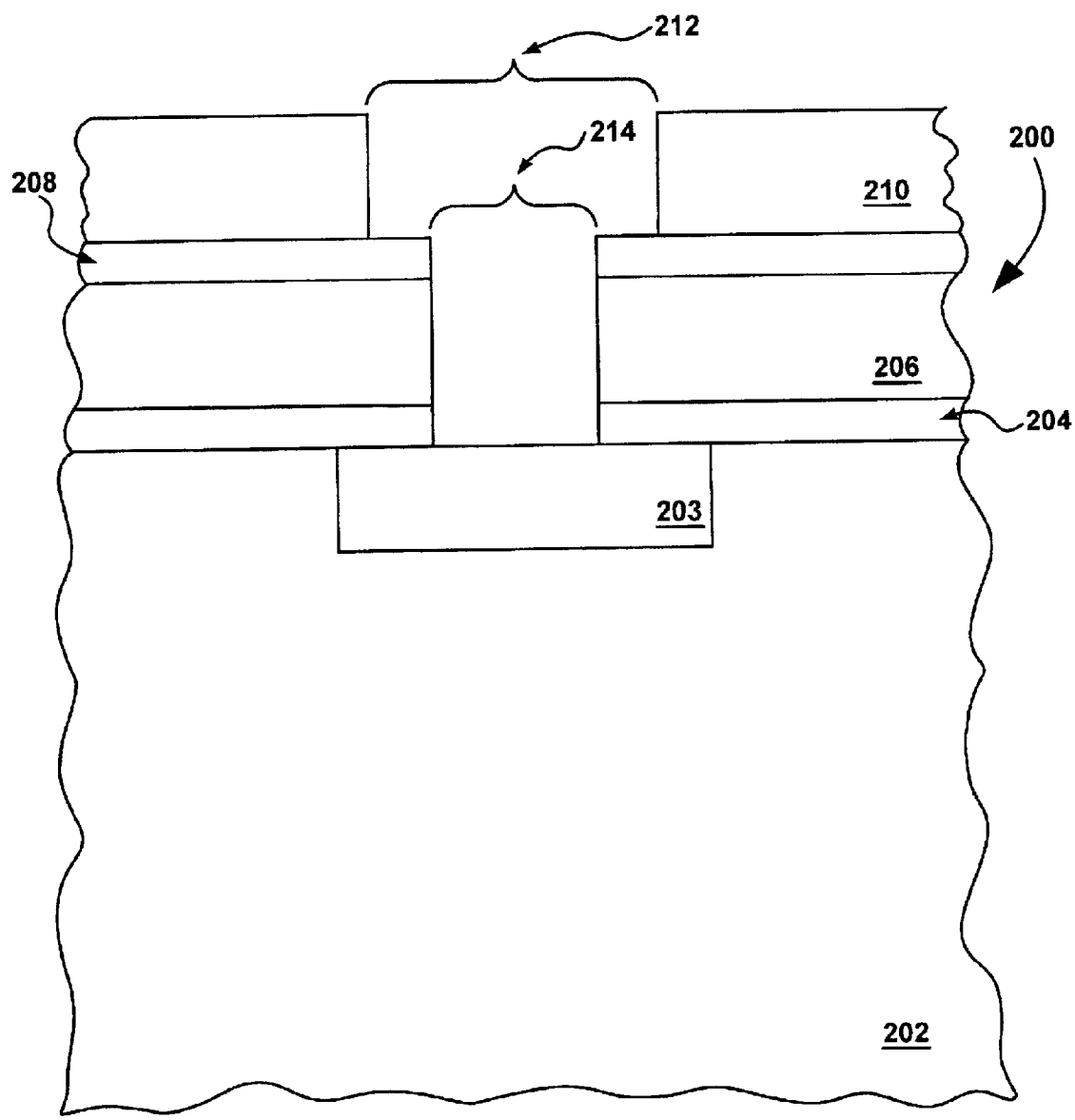
FIG. 2G is a side sectional view of the structure of FIG. 2F having an opening formed through the first material in accordance with one embodiment of the present claimed invention.
Figure 2:
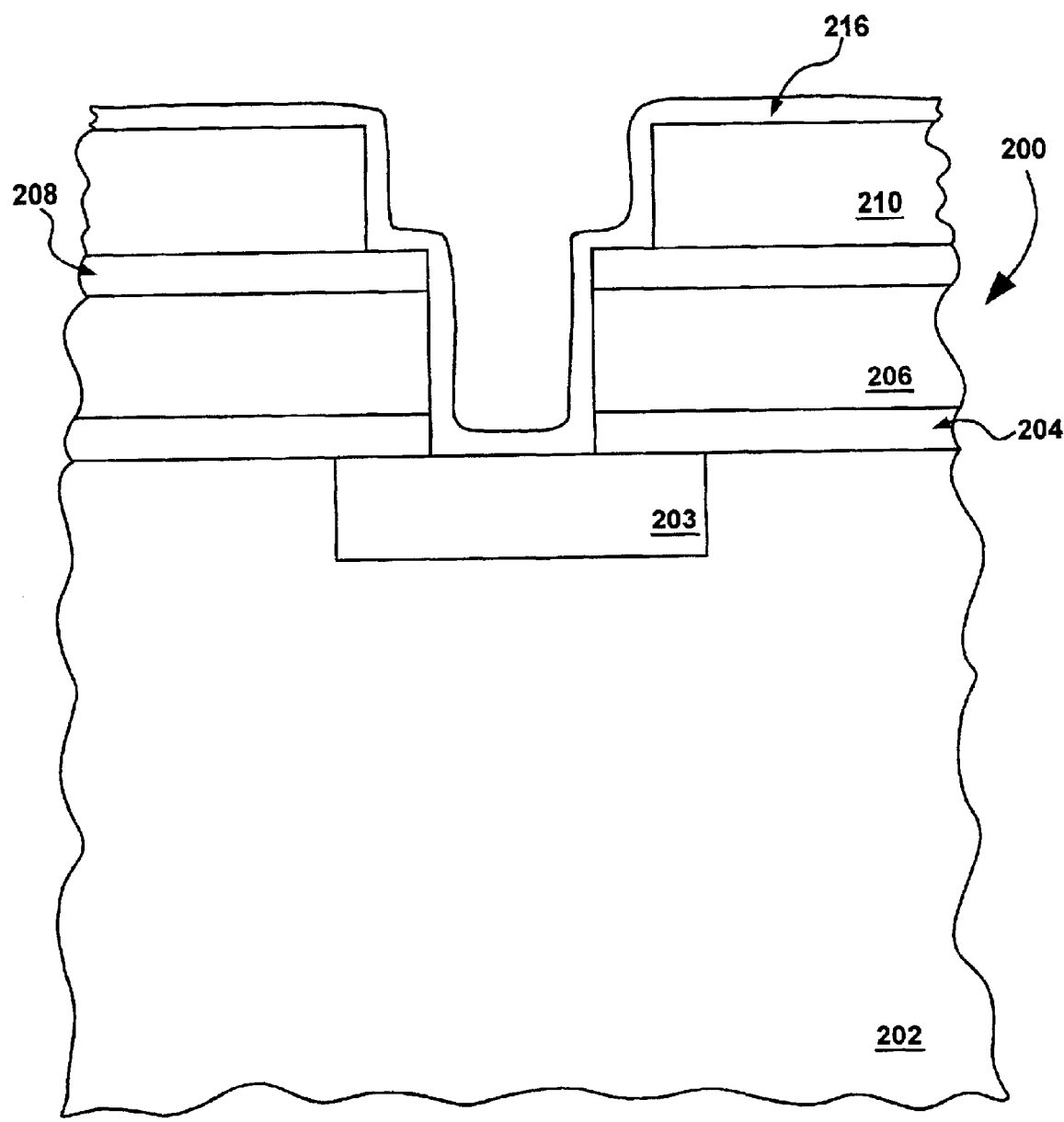
FIG. 2H is a side sectional view of the structure of FIG. 2G having a third material disposed thereover in accordance with one embodiment of the present claimed invention.
FIG. 2I is a side sectional view of the structure of FIG. 2H after the structure has been subjected to an etching operation in accordance with one embodiment of the present claimed invention.
FIG. 2J is a side sectional view of the structure of FIG. 2H after material has been deposited into the via and over the remaining portion of the structure in accordance with one embodiment of the present claimed invention.
FIG. 2K is a side sectional view of the structure of FIG. 2J after a planarizing step has been performed in accordance with one embodiment of the present claimed invention.
Figure 2I:
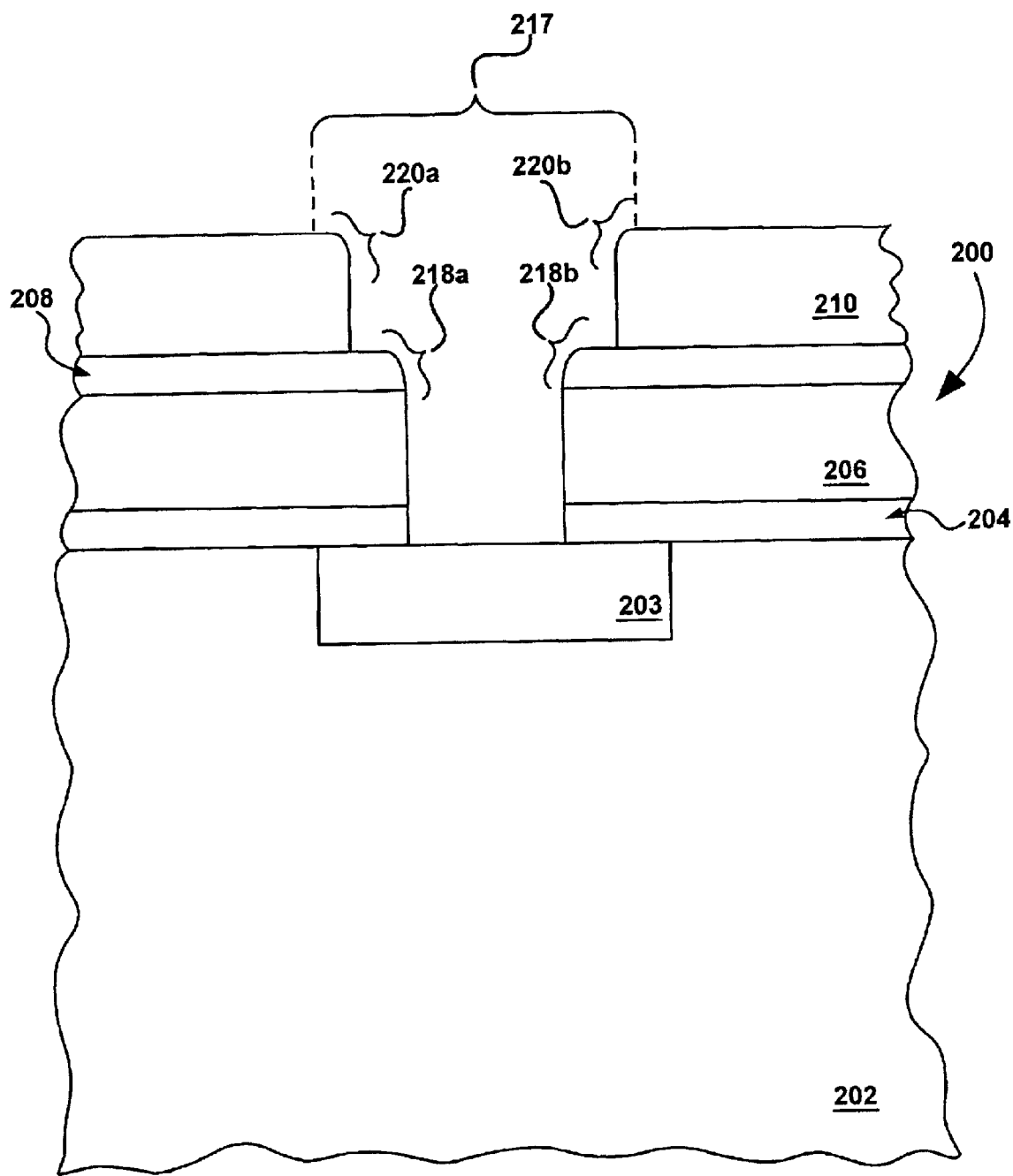
Figure 2:
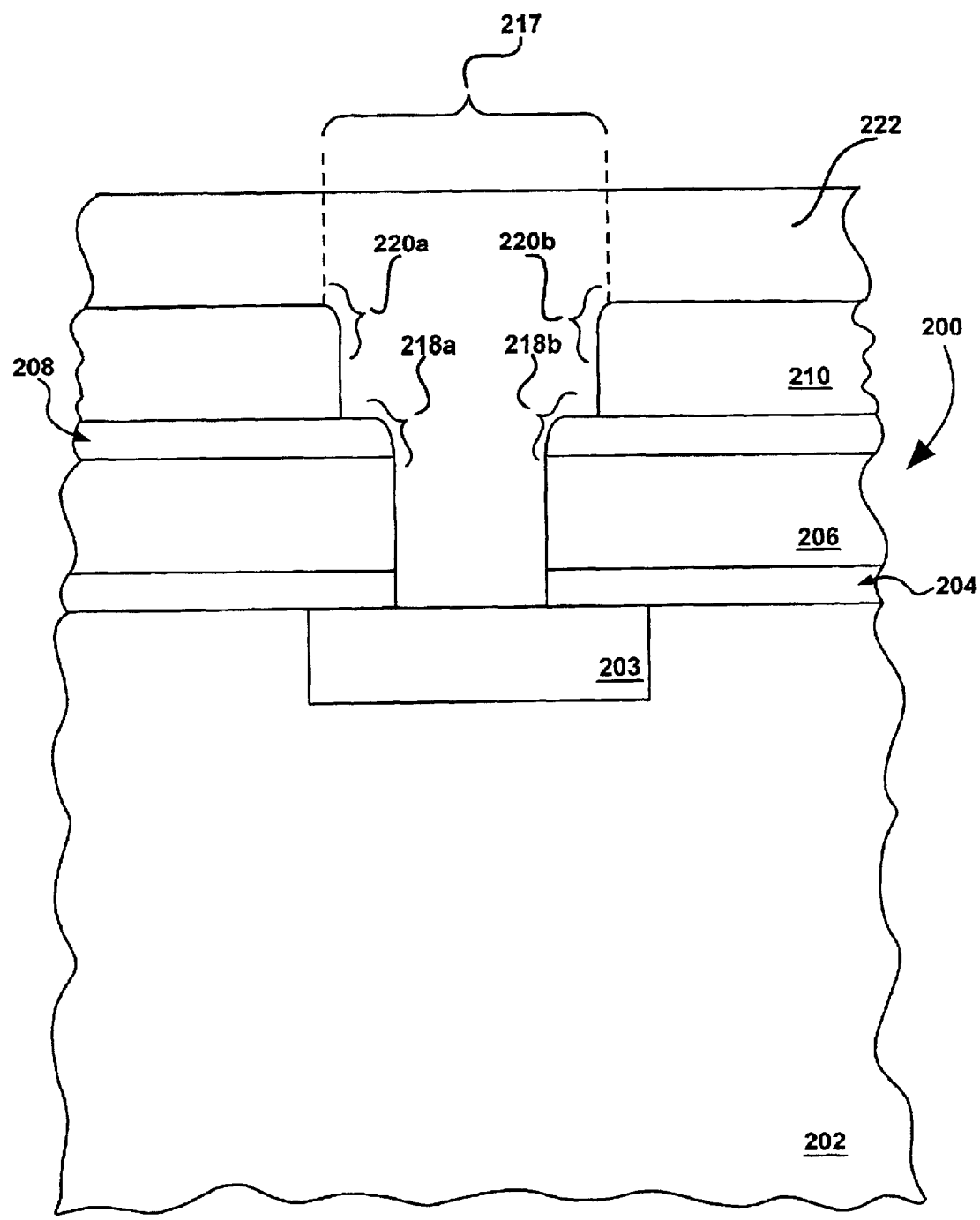
Figure 2:
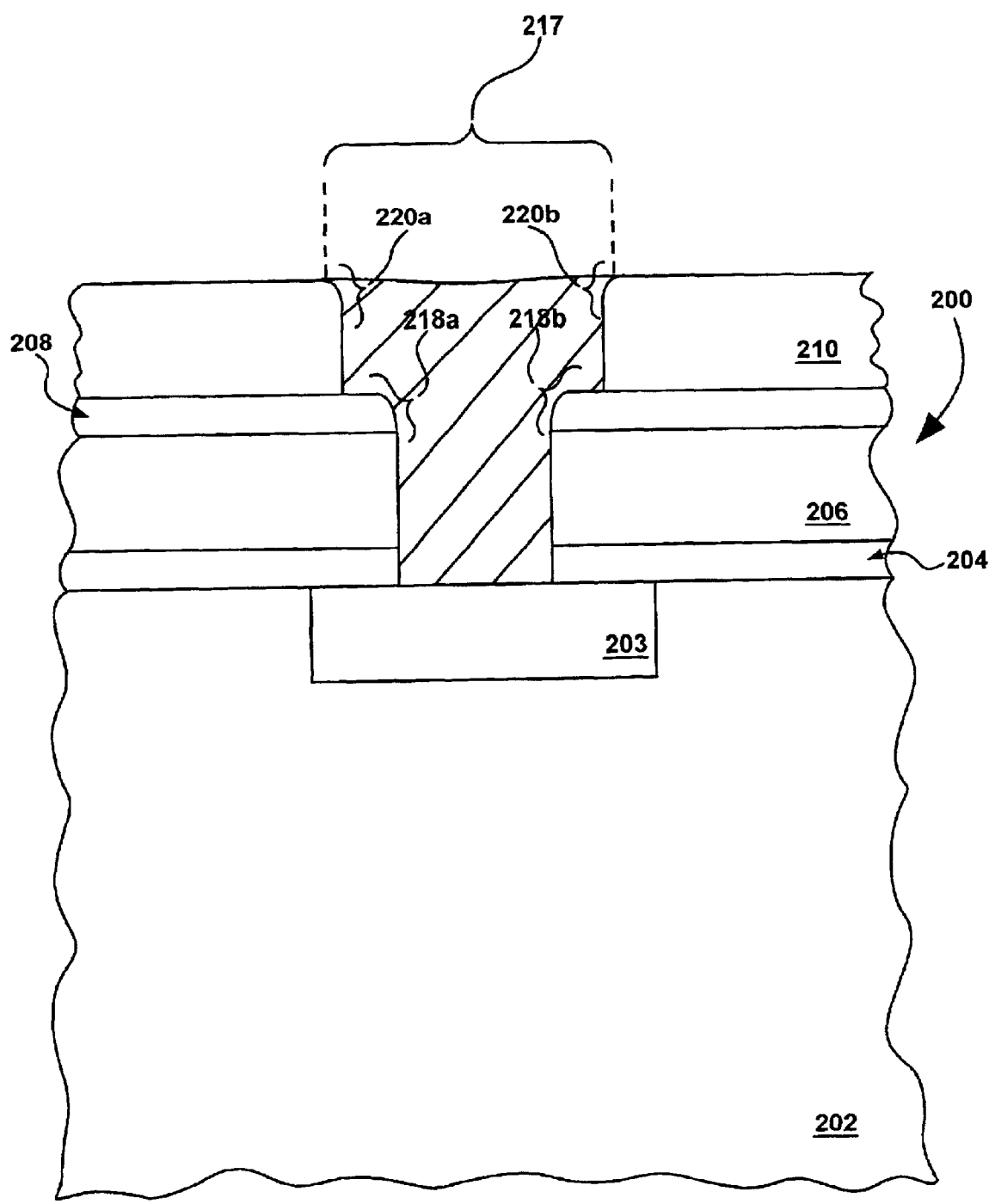
Figure 3:
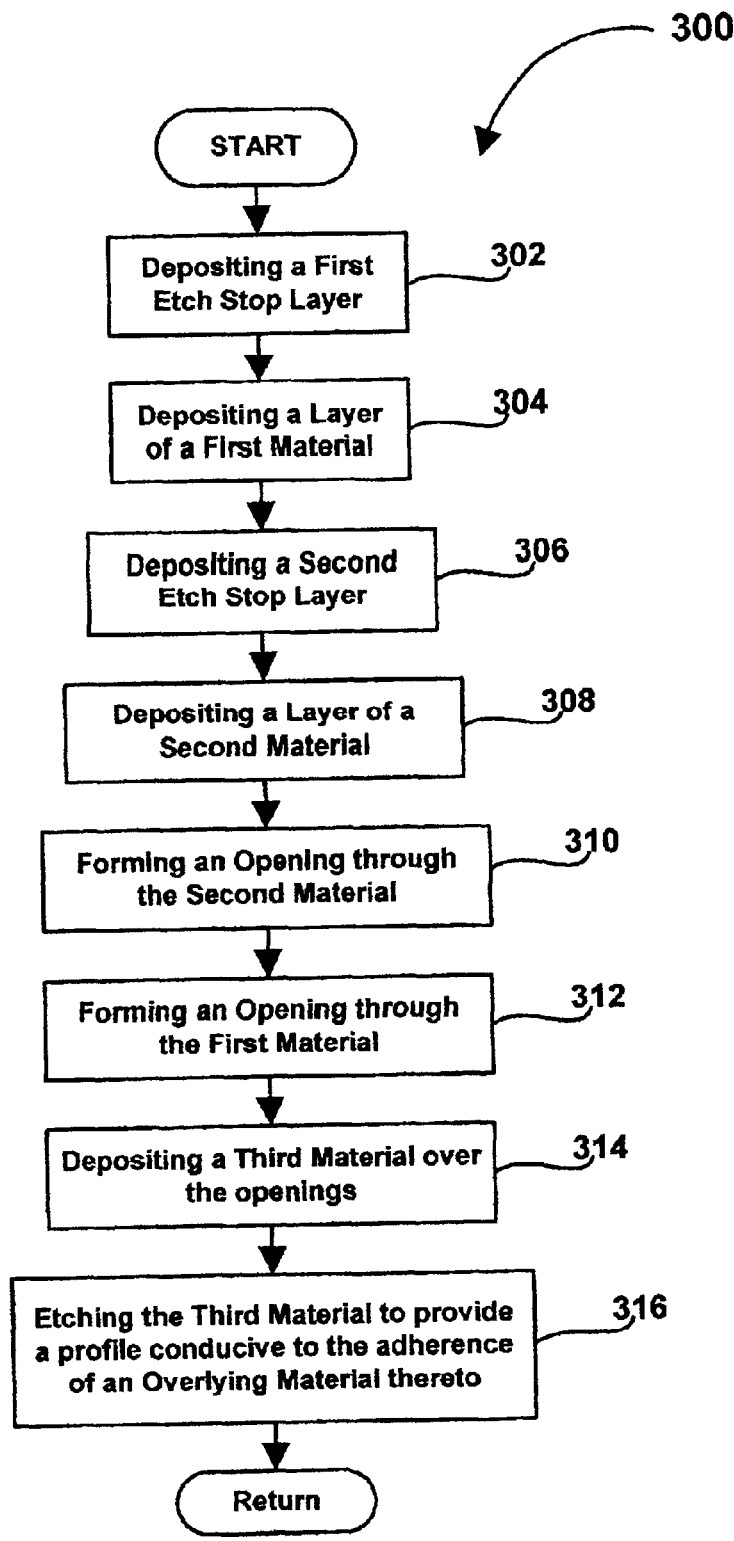
FIG. 3 is a flow chart of steps performed in accordance with one embodiment of the present claimed invention.
Figure 4:
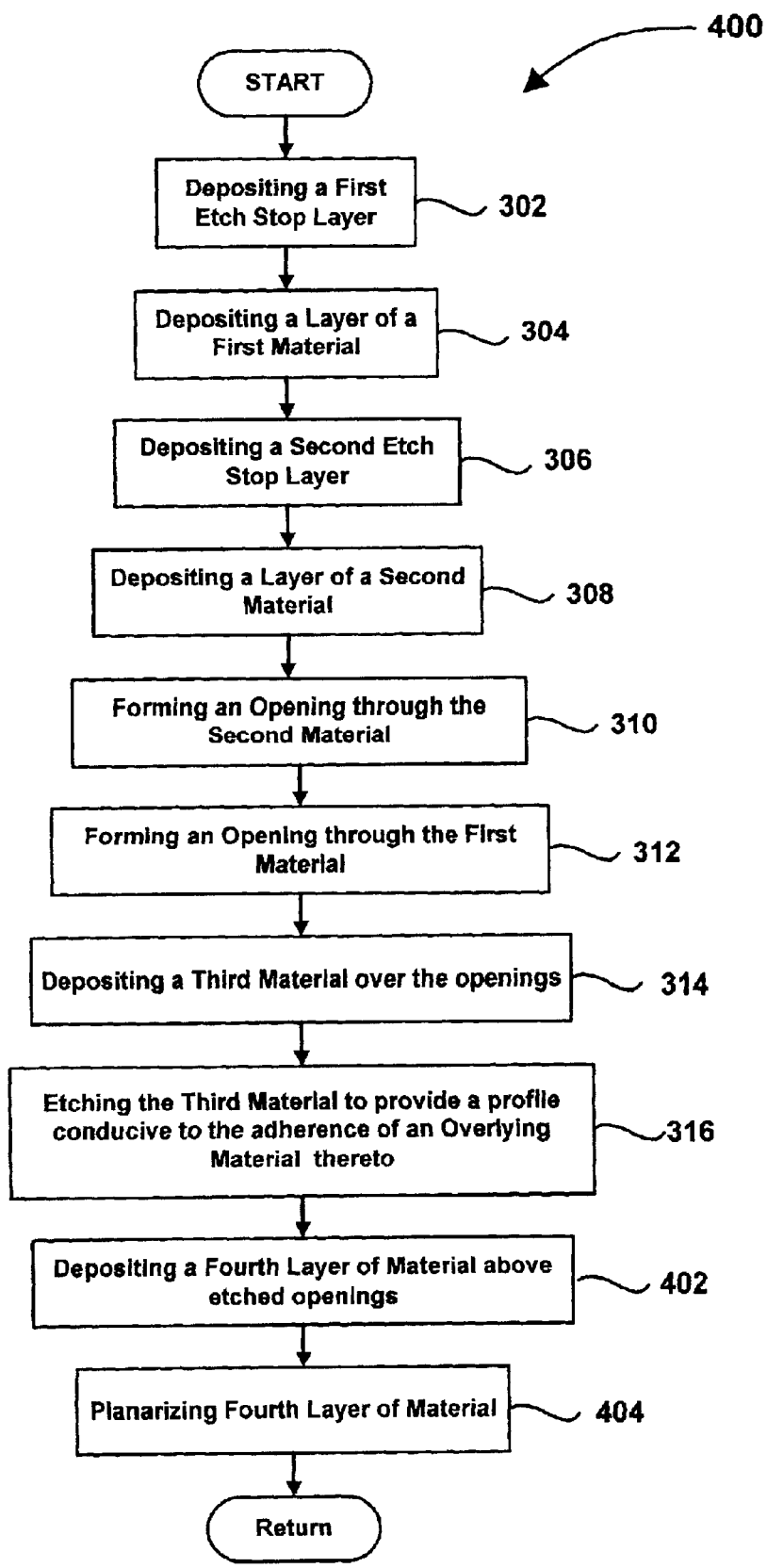
FIG. 4 is a flow chart of steps performed in accordance with another embodiment of the present claimed invention.

FIGS. 2A–2K provide side sectional views of the structure created according to embodiments of the method of the present invention as set forth in the flow charts of FIGS. 3 and 4. For purposes of clarity, the following discussion will utilize the side sectional views of FIGS. 2A–2K in conjunction with the flow charts of FIGS. 3 and 4 to clearly describe the embodiments of the present invention. Flow chart 300 of FIG. 3 begins with step 302. At step 302, the present embodiment deposits a first etch stop layer above a material 202 in which a target 203 is present. As will be described in detail below, the damascene process formed via to be created in accordance with the present embodiment is a via which, unlike conventional damascene process formed vias, will not induce the formation of voids and/or seams in the material subsequently deposited therein.

Referring still to step 302 of FIG. 3, in the present embodiment, material 202 is any material in which a target can be located. As will be understood, conductively filled damascene process formed vias are often formed to electrically couple conductive features (e.g. target 203 and a subsequently deposited overlying conductive layer) which are separated by a dielectric material. In the present embodiment, material 202 as shown in FIG. 2A is comprised of an intermetal dielectric (IMD) material such as, for example, silicon dioxide. Although such an IMD material is recited in the present embodiment, the present embodiment is well suited to the use of any other material into which it is desired to form a via. Other materials which are well suited for use as the first material include, but are not limited to, tetraethylorthosilicate (TEOS), fluorine-doped TEOS, and the like.

With reference still to step 302 of FIG. 3, first etch stop layer 204 is shown in FIG. 2B overlying material 202 and target 203. In the present embodiment first etch stop layer 204 is comprised of an oxy-nitride (ONO) layer. Although such a material is recited as comprising the first etch stop layer in the present embodiment, the present invention is also well suited to the use of various other types of materials for first etch stop layer 204.

At step 304 of FIG. 3, the present embodiment recites depositing a layer 206, shown in FIG. 2C, of a first material above first etch stop layer 204. In the present embodiment, layer of first material 206 is comprised of a material which has an etch selectivity with respect to first etch stop layer 204. That is, layer of first material 206 is comprised of a material that can be etched using an etching process wherein the etching process does not significantly etch first etch stop layer 204. Similarly, first etch stop layer 204 is comprised of a material that can be etched using a different etching process wherein the different etching process does not significantly etch layer of first material 206. In the present embodiment, layer of first material 206 is comprised of an intermetal dielectric (IMD) material such as, for example, silicon dioxide. Although such an IMD material is recited in the present embodiment, the present embodiment is well suited to the use of any other material into which it is desired to form a via. Other materials which are well suited for use as the first material include, but are not limited to, tetraethylorthosilicate (TEOS), fluorine-doped TEOS, and the like.

With reference now to step 306 of FIG. 3, the present embodiment recites depositing a second etch stop layer 208. Second etch stop layer 208 is shown in FIG. 2D overlying material 206. In the present embodiment, second etch stop layer 208 is comprised of an oxy-nitride (ONO) layer. Although such a material is recited as comprising second etch stop layer 208 in the present embodiment, the present invention is also well suited to the use of various other types of materials for second etch stop layer 208.

At step 308 of FIG. 3, the present embodiment recites depositing a layer, shown in FIG. 2E, of a second material 210 above second etch stop layer 208. In the present embodiment, layer of second material 210 is comprised of a material which has an etch selectivity with respect to second etch stop layer 208. That is, layer of second material 210 is comprised of a material that can be etched using an etching process wherein the etching process does not significantly etch second etch stop layer 208. Similarly, second etch stop layer 208 is comprised of a material that can be etched using a different etching process wherein the different etching process does not significantly etch layer of second material 210. In the present embodiment, layer of second material 210 is comprised of an intermetal dielectric (IMD) material such as, for example, silicon dioxide. Although such an IMD material is recited in the present embodiment, the present embodiment is well suited to the use of any other material into which it is desired to form a via. Other materials which are well suited for use as the first material include, but are not limited to, tetraethylorthosilicate (TEOS), fluorine-doped TEOS, and the like. Additionally, in one embodiment of the present invention, layer of first material 206 and layer of second material 210 are comprised of the same material.

Referring still to step 308, in the present embodiment both layer of first material 206 and layer of second material 210 have an etch selectivity with respect to a third material (which is discussed in detail below) such that the third material can be etched using an etching process wherein the etching process does not significantly etch layer of first material 206 or layer of second material 210. Additionally, the deposition and of first etch stop layer 204, layer of first material 206, second etch stop layer 208, and layer of second material 210 are consistent with existing damascene process flows.

At step 310, the present embodiment recites forming a first opening, opening 212 of FIG. 2F, through layer of second material 212. As shown in FIG. 2F, first opening 212 extends through layer of second material 212 and terminates at second etch stop layer 208. In the present embodiment, etching of layer of second material 210 is accomplished using a dry etch such as, for example, a plasma etch. Although such an etching process is recited in the present embodiment, the present invention is also well suited to the use of various other etching processes.

At step 312, the present embodiment recites forming a second opening, opening 214 of FIG. 2G, through layer of first material 206. As shown in FIG. 2F, first opening 212 extends through second etch stop layer 208 and through layer of first material 206. In the FIG. 2F, opening 214 is also shown extending through first etch stop layer 204 and terminating at the top surface of target 203. As mentioned above, layer of first material 206 and layer of second material 210 are comprised of material which has an etch selectivity with respect to first and second etch stop layers 204 and 208, respectively. That is, layer of second material 210 is comprised of a material that can be etched using an etching process wherein the etching process does not significantly etch second etch stop layer 208. Similarly, layer of first material 206 is comprised of a material that can be etched using an etching process wherein the etching process does not significantly etch first etch stop layer 204. It will be understood, therefore, that various breakthrough etches may be performed to etch through either first etch stop layer 208 or second etch stop layer 204 to allow for the completion of the present damascene process formed via (i.e. the via comprised of opening 212 and 214).

Referring still to step 312 and to FIG. 2G, in the present embodiment, second opening 214 originates at the bottom of first opening 212. Each of first opening 212 and second opening 214 have sidewalls and a base. Additionally, in the present embodiment second opening 214 has a smaller diameter than a diameter of first opening 212. Although such opening dimensions are shown in the present embodiment, the present invention is also well suited to the formation of a greater of lesser number of damascene process formed openings having various other physical dimensions.

At step 314, the present embodiment recites depositing a third material, material 216 of FIG. 2H, above layer of second material 210 and into openings 212 and 214. In the present embodiment, third material 216 is disposed along the sidewalls and above the base of each of first opening 212 and second opening 214. In one embodiment, third material 216 is comprised of an organic-based spin-on-glass material (e.g. HSQ, MSQ, and the like) which has an etch selectivity with respect to layer of first material 206 and layer of second material 210. Although such a material is recited in the present embodiment, the present embodiment is well suited to the use of any other material for third material 216 as long as the material has an etch selectivity with respect to layer of first material 206 and layer of second material 210. Hence, third material 216 may be etched without significantly etching first etch stop layer 204, layer of first material 206, second etch stop layer 208, or layer of second material 210.

Referring still to step 314 and FIG. 2H, as mentioned above, third material 216, is comprised of a conformal material which has an etch selectivity with respect to layer of first material 206 and layer of second material 210. Additionally, in the present embodiment, third material 216 is deposited to a depth which corresponds to the critical dimension, CD, of the via to be formed by the present damascene process. For example, in one embodiment, third material 216 is deposited to a depth of approximately 10–30 percent of the CD of the via to be formed (e.g. the diameter of opening 212). As an example, where opening 212 is to have a width or CD of 0.5 microns, third material 216 will be deposited with a depth of approximately 0.05 to 0.15 microns (i.e. 500 to 1500 Angstroms). Although such a depth for third material 216 is recited in the present embodiment, the present embodiment is well suited to depositing third material 216 to various greater or lesser depths. More importantly, in the present embodiment, third material 216 should conformally cover the sidewalls and the base of each of first opening 212 and second opening 214.

Referring now to step 316, the present embodiment then etches third material 216 such that an opening extends to the top surface of target 203 as shown in FIG. 2I. Referring now to FIG. 2I, for purposes of clarity, in the structure remaining after step 316, third material 216 is shown combined with layer of first material first layer 204 of the second material and second layer 204 of the second material are shown in combination as layer 214. The etching process which etches third material 216 does not substantially etch layer of first material 206 or layer of second material 210. Importantly, in the present embodiment, the remaining opening, opening 217, has a profile conducive to the adherence of overlying material thereto. That is, unlike vias generated using prior art damascene processes, opening 217 of the present embodiment has a profile including rounded corners 218a and 218b, and 220a and 220b. By having rounded top edge corners 218a and 218b, and 220a and 220b, as opposed to the sharp corners associated with prior art vias, opening 217 does not induce stress in subsequently deposited overlying layers. Hence, opening 217 of the present embodiment does not deleteriously reduce adherence of overlying layers thereto.

Additionally, in one embodiment of the present invention, unlike vias generated using prior damascene-process based via formation methods, opening 217 of the present embodiment has a profile including sloped sidewalls. By having sloped sidewalls, as opposed to the vertical sidewalls associated with prior damascene process-based vias, opening 217 readily accommodates the adherence of overlying materials thereto. Hence, opening 217 of the present embodiment does not deleteriously reduce adherence of overlying layers thereto.

Referring still to step 316 of FIG. 3, in this embodiment, the damascene-based via formation method of the present embodiment is readily manufactured using existing semiconductor fabrication processes. That is, the present damascene-based via formation method is compatible with existing semiconductor fabrication processes. Additionally, as will be discussed below in conjunction with another embodiment of the present embodiment, via 217 of the present embodiment enables the formation of a metallized interconnect which does not suffer from void/seam formation.

With reference now to FIG. 4, a flow chart 400 is shown of steps performed in accordance with another embodiment of the present claimed invention in which a metallized interconnect is formed. As shown in flow chart 400, the method of the present embodiment includes the steps and features of the above-described embodiment (i.e. as recited in steps 302–316, and shown in FIGS. 2A–2I). For purposes of brevity and clarity, a discussion of these steps is not repeated here. The method of the present embodiment includes additional steps 402 and 404 which are described below in detail.

At step 402, as illustrated in FIG. 2J, the present embodiment deposits a layer 222 of a fourth material above the structure of FIG. 2I and into via 217. Moreover, due to the profile of opening 217 as described above in detail, layer 222 of the fourth material adheres strongly to the edges of opening 217. That is, because opening 217 has rounded top edge corners 218a and 218b, and 220a and 220b, via 217, facilitates adherence of thereto by a subsequently deposited overlying layer (e.g. layer 222 of fourth material). As a result, the present embodiment does not suffer from corner nucleation (caused in part by sharp opening edges), and subsequent void and/or seam formation in layer 222 of the fourth material. In one embodiment of the present invention, layer 222 of fourth material is comprised of a conductive metallic layer such as, for example, tungsten. Although such a conductive material is recited in the present embodiment, the present embodiment is well suited to the use of any other conductive material from which it is desired to form a metallized interconnect. Other materials which are well suited for use as the third material include, but are not limited to, aluminum, copper, various alloys, and the like.

At step 404, and as illustrated in FIG. 2K, the present embodiment completes the formation of the metallized interconnect by performing a planarization step to remove fourth material 222 disposed above layer of second material 210 such that excess fourth material is removed and such that fourth material 222 remains only in opening 217. As a result, the present embodiment provides a metallized interconnect which is substantially free of the voids and/or seams associated with metallized interconnects formed in conjunction with conventional damascene process-based vias.

Thus, the present invention provides a method for forming a via in a damascene process wherein the via does not suffer from poor adherence to a subsequently deposited overlying layer. The present invention further provides a method for forming a via in a damascene process which enables the formation of a metallized interconnect wherein the method achieves the above accomplishment and wherein the metallized interconnect does not suffer from void/seam formation. The present invention also provides a method for forming a via in a damascene process wherein the method achieves all of the above-listed accomplishments and wherein the method is compatible with existing semiconductor fabrication processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A method for forming a via in a damascene process, said method comprising the steps of:
   a) depositing a first etch stop layer proximate to a target to which is desired to form an electrical connection;
   b) depositing a layer of a first material above said first etch stop layer;
   c) depositing a second etch stop layer above said layer of said first material;
   d) depositing a layer of a second material above said second etch stop layer;
   e) forming a first opening through said layer of said second material;
   f) forming a second opening originating at the bottom of said first opening, said second opening extending through said second etch stop layer and said layer of said first material, each of said first opening and said second opening having sidewalls and a base;
   g) depositing a third material above said second material, said third material disposed along said sidewalls and above said base of said first opening and said second opening; and
   h) fully etching said third material such that said first opening and said second opening have a profile from said first material, said second material, said first etch stop layer, and said second etch stop layer that is conducive to the adherence of overlying material thereto, said etching of said third material performed without substantially etching said first material and said second material.

2. The method for forming a via in a damascene process as recited in claim 1 further comprising the steps of:
   i) depositing a layer of a fourth material above said third material and said second material and into said first opening and said second opening remaining after step h) such that said fourth material adheres to said sidewalls and said base of said first opening and said second opening; and
   j) performing a planarization step to remove said fourth material disposed above said second material such that said fourth material remains only in said first opening and said second opening.

3. The method for forming a via in a damascene process as recited in claim 1 wherein said first material and second material are comprised of the same material.

4. The method for forming a via in a damascene process as recited in claim 1 wherein said second opening has a smaller diameter than a diameter of said first opening.

5. The method for forming a via in a damascene process as recited in claim 1 wherein step b) comprises depositing a layer of a first material, comprised of intermetal dielectric above said first etch stop layer.

6. The method for forming a via in a damascene process as recited in claim 1 wherein step d) comprises depositing a layer of a second material, comprised of intermetal dielectric above said second etch stop layer.

7. The method for forming a via in a damascene process as recited in claim 1, wherein said first material and said second material have an etch selectivity with respect to said third material such that said third material can be etched using a first etch process wherein said first etch process does not significantly etch said first material and said second material.

8. The method for forming a via in a damascene process as recited in claim 1, wherein step g) comprises depositing a substantially conformal layer of material having an etch selectivity with respect to said first material and said second material along said sidewalls and above said base of said first opening and said second opening.

9. The method for forming a via in a damascene process as recited in claim 1, wherein step h) comprises etching said third material such that said first opening and said second opening each have a profile including rounded upper corners.

10. In a via formed into a substrate using a damascene process, a method for providing a via profile which is conducive to the adherence of overlying material thereto, said method comprising the steps of:
 a) depositing a material into said via formed using said damascene process, said material disposed along the sidewalls and the base of said via, said material having an etch selectivity with respect to said substrate into which said via is formed; and
 b) fully etching said material such that said via is formed having a profile conducive to the adherence of overlying material thereto without the formation of sidewalls from said material, said etching of said material performed without substantially etching said substrate into which said via is formed.

11. The method for providing a via profile which is conducive to the adherence of overlying material thereto as recited in claim 10 further comprising the steps of:
 c) depositing a conductive material above said material and into said via remaining after step b) such that said conductive material adheres to said sidewalls and said base of said via; and
 d) performing a planarization step to remove said conductive material which is disposed other than in said via.

12. The method for providing a via profile which is conducive to the adherence of overlying material thereto as recited in claim 10 wherein said substrate into which said via is formed is comprised of an intermetal dielectric material.

13. The method for providing a via profile which is conducive to the adherence of overlying material thereto as recited in claim 10, wherein step c) comprises depositing a substantially conformal layer of conductive material having an etch selectivity with respect to said substrate along said sidewalls and said base of said via.

14. The method for providing a via profile which is conducive to the adherence of overlying material thereto as recited in claim 10, wherein step d) comprises etching said conductive material such that said via has a profile including rounded upper corners.

15. The method for providing a via profile which is conducive to the adherence of overlying material thereto as recited in claim 10, wherein step d) comprises etching said conductive material such that said via has sloped sidewalls.

16. A method for forming a metallized interconnect in a damascene process, said method comprising the steps of:
 a) depositing a first etch stop layer proximate to a target to which is desired to form an electrical connection;
 b) depositing a layer of a first material above said first etch stop layer;
 c) depositing a second etch stop layer above said layer of said first material;
 d) depositing a layer of a second material above said second etch stop layer;
 e) forming a first opening through said layer of said second material;
 f) forming a second opening originating at the bottom of said first opening, said second opening extending through said second etch stop layer and said layer of said first material, each of said first opening and said second opening having sidewalls and a base;
 g) depositing a substantially conformal third material above said second material, said third material disposed along said sidewalls and above said base of said first opening and said second opening, said third material having an etch selectivity with respect to said first material and said second material such that said third material can be etched using a first etch process wherein said first etch process does not significantly etch said first material and said second material;
 h) etching said third material such that said first opening and said second opening have a profile from said first material, said second material, said first etch stop layer, and said second etch stop layer that is conducive to the adherence of overlying material thereto, said etching of said third material performed without substantially etching said first material and said second material, and wherein said profile includes rounded upper corners in said second material and said second etch stop layer;
 i) depositing a layer of a fourth material above said third material and said second material and into said first opening and said second opening remaining after step h) such that said fourth material adheres to said sidewalls and said base of said first opening and said second opening; and
 j) performing a planarization step to remove said fourth material disposed above said second material such that said fourth material remains only in said first opening and said second opening.

17. The method for forming a metallized interconnect in a damascene process as recited in claim 16 wherein said first material and second material are comprised of the same material.

18. The method for forming a metallized interconnect in a damascene process as recited in claim 16 wherein step b) comprises depositing a layer of a first material, comprised of intermetal dielectric above said first etch stop layer.

19. The method for forming a metallized interconnect in a damascene process as recited in claim 16 wherein step d) comprises depositing a layer of a second material, comprised of intermetal dielectric above said second etch stop layer.

20. The method for forming a metallized interconnect in a damascene process as recited in claim 16, wherein step h) comprises fully etching said third material such that said first opening and said second opening each have a profile including rounded upper corners.

21. The method for forming a metallized interconnect in a damascene process as recited in claim 16, wherein step h) comprises etching said third material such that said first opening and said second opening each have a profile including sloped sidewalls.

* * * * *